US008140281B2

(12) United States Patent  (10) Patent No.: US 8,140,281 B2
Ishikawa et al.  (45) Date of Patent: Mar. 20, 2012

(54) VOLTAGE DETECTING DEVICE

(75) Inventors: Satoshi Ishikawa, Shizuoka (JP);
Kimihiro Matsuura, Shizuoka (JP);
Masashi Sekizaki, Shizuoka (JP)

(73) Assignee: Yazaki Corporation, Tokyo (JP)

( * ) Notice: Subject to any disclaimer, the term of this patent is extended or adjusted under 35 U.S.C. 154(b) by 556 days.

(21) Appl. No.: 12/314,850

(22) Filed: Dec. 17, 2008

(65) Prior Publication Data
US 2009/0164154 A1    Jun. 25, 2009

(30) Foreign Application Priority Data

Dec. 25, 2007 (JP) ................................ 2007-332683

(51) Int. Cl.
*G01R 31/36* (2006.01)

(52) U.S. Cl. ............... 702/63; 702/60; 702/64; 702/68

(58) Field of Classification Search ............... 702/63, 702/68, 60, 64, 65; 324/427, 429, 713; 320/118, 320/119
See application file for complete search history.

(56) References Cited

U.S. PATENT DOCUMENTS 6,150,860 A * 11/2000 Chun ........................... 327/198
7,405,579 B2 * 7/2008 Okamoto et al. ............. 324/713
7,489,112 B2 * 2/2009 Ishikawa et al. ............. 320/161

FOREIGN PATENT DOCUMENTS

JP   2006-042591   2/2006
JP   2007-187649   7/2007

* cited by examiner

*Primary Examiner* — Michael Nghiem
*Assistant Examiner* — Elias Desta
(74) *Attorney, Agent, or Firm* — Edwards Wildman Palmer LLP

(57) ABSTRACT

The present invention is to provide inexpensively a voltage detecting device for setting an address of each voltage detection IC even if a power source level of each voltage detection IC differs. A first transmitting line LT1 and a first receiving line LR1 connect a plurality of voltage detection ICs in series each other, and connect between the bottom voltage detection IC and the main microcomputer. The main microcomputer transmits an address number 0 to the bottom voltage detection IC. When the respective voltage detection ICs receive an address number through the first receiving line of a lower side from the main microcomputer, an address number adding 1 to the received address number is set as a self-address number. Furthermore, the respective voltage detection ICs transmit the address number which adds 1 to the received address number to the first transmitting line LT1 of an upper side.

5 Claims, 7 Drawing Sheets

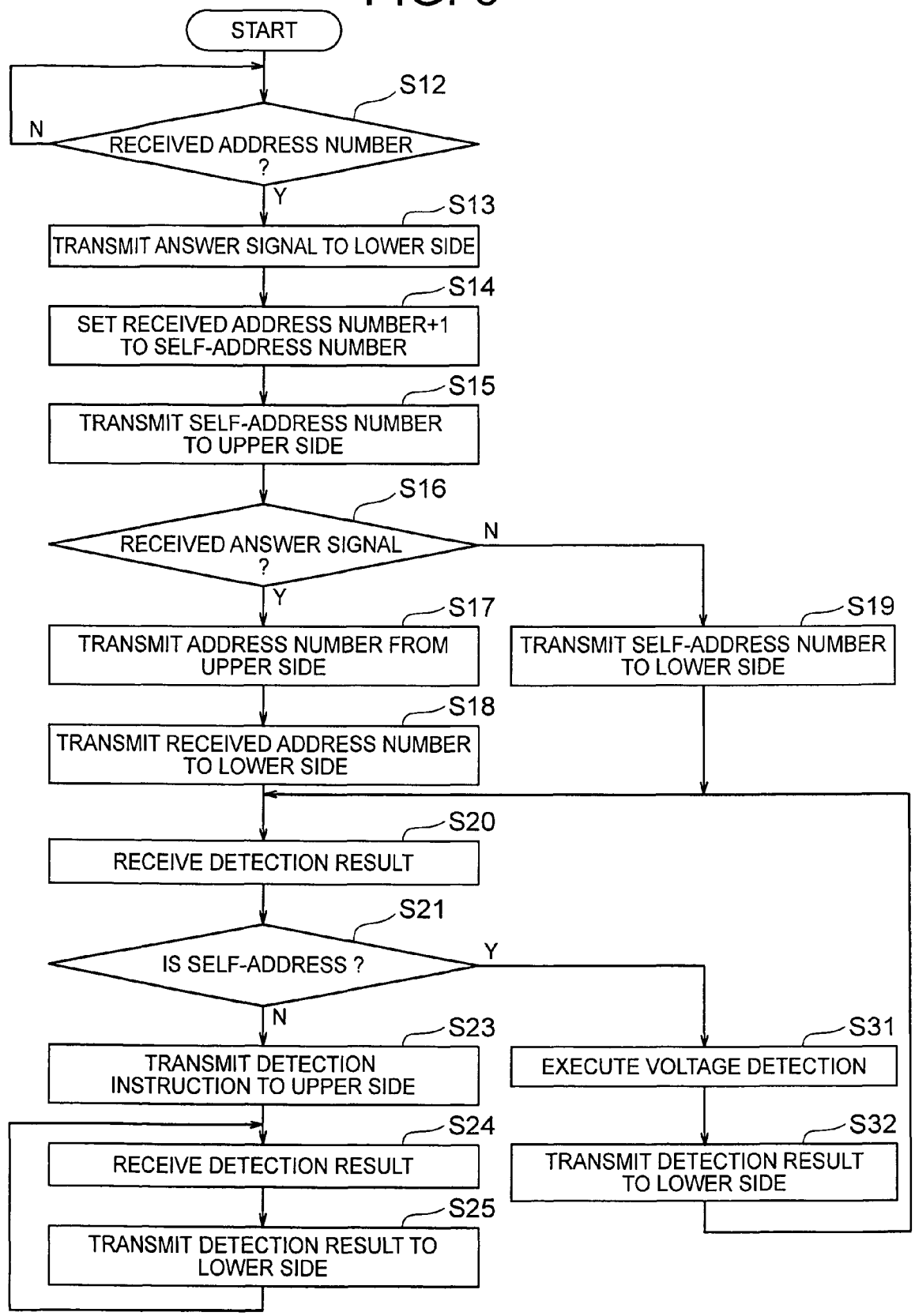

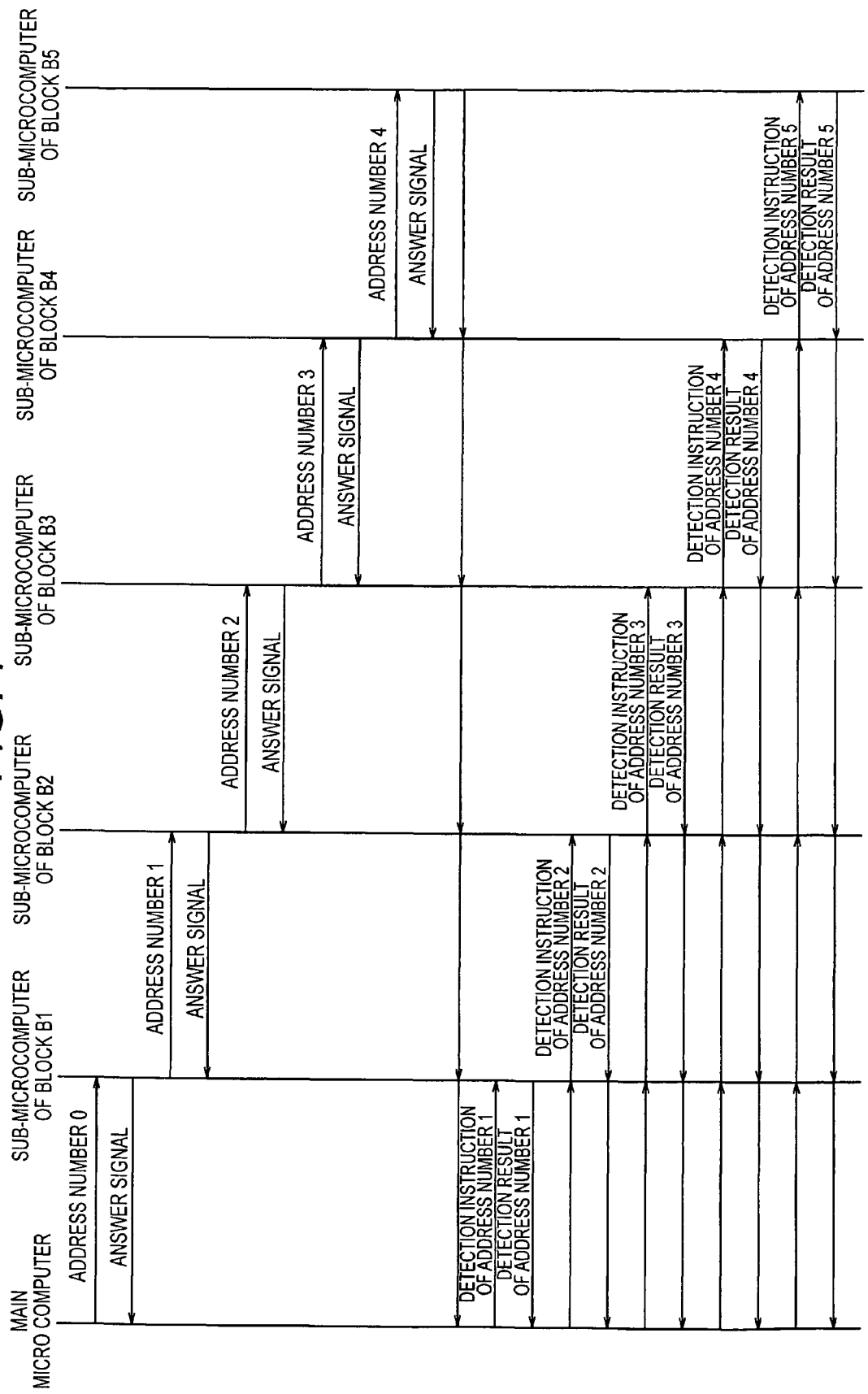

VOLTAGE DETECTING DEVICE

The priority application Number Japan Patent Application No. 2007-332683 upon which this patent application is based is hereby incorporated by reference.

BACKGROUND OF THE INVENTION

1. Filed of the Invention

The present invention relates to a voltage detecting device, particularly to a voltage detecting device for detecting each voltage of each block of a plurality of blocks divided from a battery unit formed with a plurality of unit cells, which is secondary battery type, connected in series to each other.

2. Description of the Related Art

Recently, a hybrid electric vehicle (HEV), which travels by using both an engine and an electric motor, has been widely used. The HEV has a low voltage battery of 12 volts for starting the engine, and a high voltage battery for driving the electric motor. The high voltage battery is formed with a plurality of unit-cells, connected in series, such as a nickel-metal hydride secondary battery or a lithium secondary battery.

The above high voltage battery including battery packs is divided into a plurality of blocks, and provides respective blocks with a voltage detection IC (Integrated Circuit), for example, patent documents 1 and 2. The respective voltage detection IC detects both terminals of unit cells, and transmits the detected the detected result to a main microcomputer (control device) which controls the high voltage battery. The plurality of voltage detection ICs is connected to the main microcomputer through a common communication line so as to reduce lines or terminals.

In the above described multiple voltage detection ICs, an address is set so as to give and receive a signal between the main microcomputer and a plurality of voltage detection ICs through the common communication line. Thereafter, each voltage detection IC attaches a self-address to the detected result, and transmits. Thereby, the main microcomputer can distinguish the unit cell of the block by the detected result which is received.

As a method setting this address, a method for appending an address selecting switch to an external terminal of the voltage detection IC and for selecting an address depending on ON/OFF of the address selecting switch is known. However, the above conventional method should provide the voltage detection IC with a special external terminal so as to select the address. Furthermore, since a lot of external terminals are required by the number of address, it causes an increasing manufacturing cost.

Alternatively, another method for using power sources of all voltage detection ICs as a common power source, transmitting an address signal to a power source line and setting the address of respective voltage detection IC is known. However, in the above mentioned conventional method, it is necessary to equalize an electrical potential of power source in the voltage detection IC. Thereby, when the electrical potential of power source in the respective voltage detection IC is not equalized, the conventional method can not be used with a voltage detecting device.

Patent Documents 1:
Japan published patent application 2006-42591
Patent Documents 2:
Japan published patent application 2007-187649

SUMMARY OF THE INVENTION

Objects to be Solved

It is therefore an objective of the present invention to solve the above problem and to provide a voltage detecting device, which can set an address of respective voltage detecting units even if a power source level of respective voltage detecting units differ.

How to Attain the Object of the Present Invention

According to a first aspect of the present invention, a voltage detecting device includes a plurality of voltage detecting units for detecting a voltage between both terminals of each unit cell, which is secondary battery type, included in respective blocks, the voltage detecting unit being provided for each block of the respective blocks divided from a battery unit formed with a plurality unit cells connected in series to each other, and a control device for receiving a detection result from the voltage detecting unit. The voltage detecting device has a first communication line for connecting the plurality of voltage detecting units in series each other, and for connecting between a top end or bottom of the plurality of the voltage detecting units and the control device. The control device transmits an address number to the voltage detecting unit connected through the first communication line. The respective voltage detecting unit performs an action for setting an address, the action setting the received address number or an address number adding a predetermined value to the received address number as a self-address number and transmitting an address number adding 1 to the received address number to the first communication line away from the control device when the respective voltage detecting unit receives the address number through the first communication line from the control device.

According to a second aspect of the present invention, when the voltage detecting unit is not connected to the first communication line away from the control device, the respective voltage detecting unit transmits the self-address number to the voltage detecting unit connected to the control device through the first communication line. Furthermore, when the address number is received through the first communication line away from the control device, the respective voltage detecting unit transmits the received address number to the first communication line connected to the control device.

According to a third aspect of the present invention, the voltage detecting device has a second communication line for connecting the control device to the plurality of the voltage detecting unit. The control device transmits a power source signal to the second communication line. When the plurality of the voltage detecting units receives the power source signal through the second communication line, a power source is supplied to the voltage detecting unit.

According to a fourth aspect of the present invention, the voltage detecting unit performs the action for setting the address whenever the power source is supplied.

Effect of the Invention

According to the present invention, an address of respective voltage detecting unit can be set by communication through the first communication line. Furthermore, although the power source level of respective voltage detecting unit differ, the address of respective voltage detecting unit can be set.

According to the present invention, an address number of voltage detecting unit, which is farthest away from the control device, can be automatically transmitted to the control device. Thereby, it is not required to set the address number of voltage detecting unit being farthest away from the control device.

According to the present invention, the voltage detecting device of the present invention can control ON/OFF of power source against the voltage detecting unit by the control device.

According to the present invention, action for setting an address can be automatically performed by supplying power source without an external terminal which makes the voltage detecting unit start the action for setting the address. As a result, a cost can be reduced.

The above and other objects and features of this invention will become more apparent from the following description taken in conjunction with the accompanying drawings.

BRIEF DESCRIPTION OF THE DRAWINGS

FIG. 6 is a flowchart showing a process of a sub-microcomputer shown in FIG. 1; and FIG. 7 illustrates transmitting and receiving of a signal between the main microcomputer and the sub-microcomputer.

DESCRIPTION OF THE PREFERRED EMBODIMENT

Figure 1:
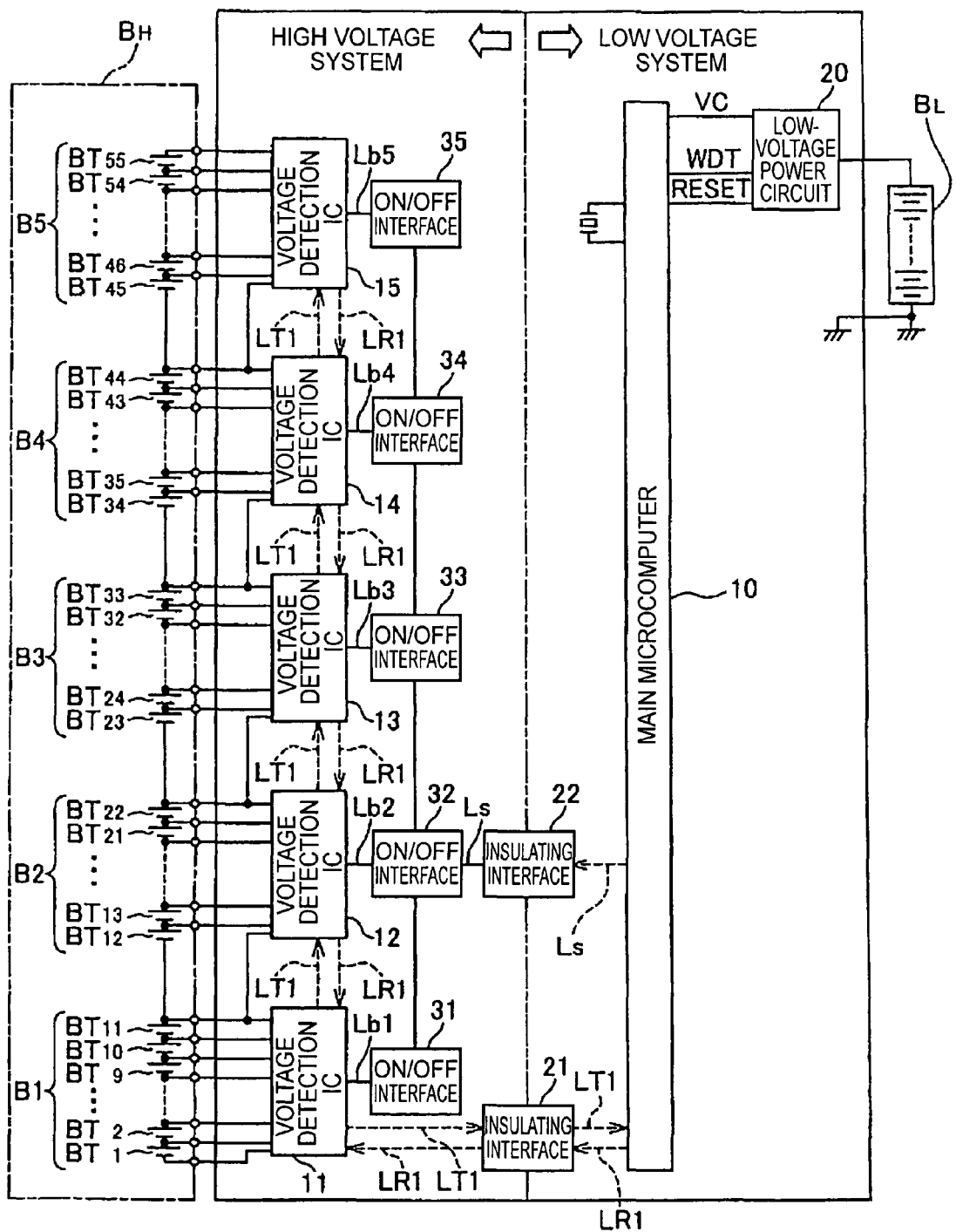
FIG. 1 is a circuit diagram showing a preferred embodiment of a voltage detecting device according to the present invention.

Embodiments of the present invention are explained by referring to drawings. In the preferred embodiment, a voltage detecting device is mounted on a vehicle. A reference numeral BL denotes a low-voltage battery. The low-voltage battery BL has a plurality of a secondary battery as shown in FIG. 1 The low-voltage battery BL powers a starter to start an engine and is connected with an alternator (not shown) as a battery changer.

A reference numeral BH in FIG. 1 denotes a high-voltage battery as a battery pack. The high-voltage battery BH powers an electric motor of a Hybrid Electric Vehicle (HEV) and is as appropriate connected with the alternator (not shown) as the battery charger.

The high-voltage battery BH is, for example, divided into for example five blocks B1-B5. Each block B1-B5 has eleven unit cells of BT1-BT11, BT12-BT22, BT23-BT33, BT34-BT44, and BT45-BT55. Each unit cell BT1-BT55 has a secondary battery.

The voltage detecting device has a main microcomputer 10 as a control device, and voltage detection ICs (Integrated Circuits) 11-15 as a voltage detecting unit. The main microcomputer 10 has a well-known CPU, ROM and RAM. The main microcomputer 10 is powered by a low-voltage power circuit 20, and controls the voltage detection ICs 11-15. The low-voltage power circuit 20 generates an operating voltage Vc of the main microcomputer 10 from a supply voltage of the low-voltage battery BL.

Figure 2:
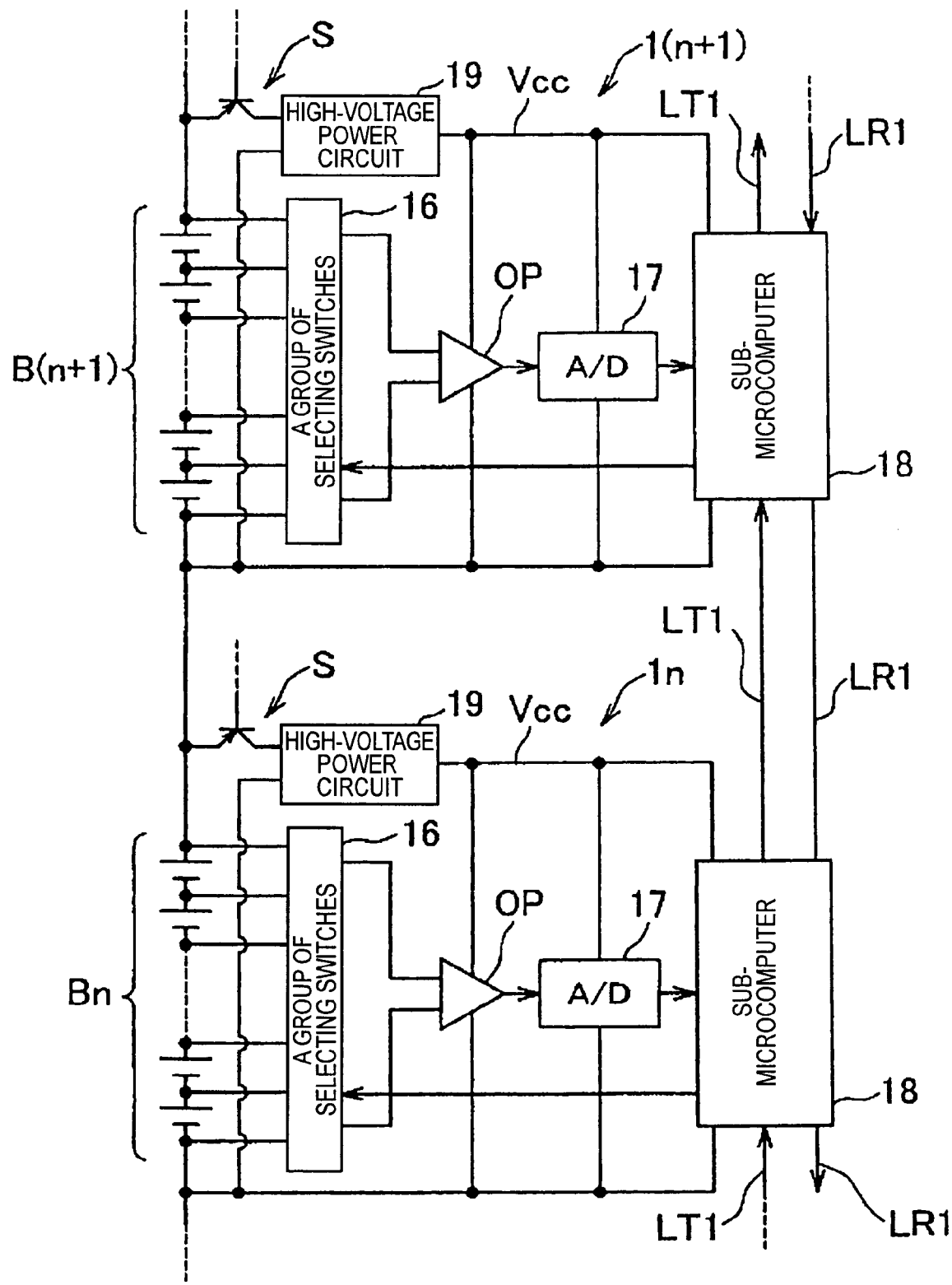
FIG. 2 is a circuit diagram showing details of the voltage detection IC in FIG. 1.

The above voltage detection ICs 11-15 are provided corresponding to the blocks B1-B5, respectively. As shown in FIG. 2, the voltage detection ICs 11-15 receive electrical supply from the respective unit cells of BT1-BT11, BT12-BT22, BT23-BT33, BT34-BT44, and BT45-BT55 that construct the respective blocks B1-B5. That is, the voltage detection ICs 11-15 have the respective ground levels on a negative terminal of the respective blocks B1-B5 and have the ground level different from one another. Thereby, a withstanding voltage of the voltage detection ICs 11-15 can be reduced.

Each voltage detection IC 11-15 has a group of selecting switches 16, a differential amplifier OP, an A/D converter 17, a sub-microcomputer 18, a high-voltage power circuit 19, and a breaker switch S. The group of selecting switches 16 has a plurality of switches, each of the switches is connected to one unit cell of the respective blocks B1-B5 and is normally closed. The group of selecting switches 16 connects both ends of one of the plurality of unit cells BT1-BT55 to the differential amplifier OP. The differential amplifier OP outputs a voltage of the unit cells BT1-BT55 connected by the group of selecting switches 16 to the A/D converter 17. The A/D converter 17 converts the voltage of the unit cells BT1-BT55 from the differential amplifier OP, and outputs the converted voltage to the sub-microcomputer 18.

The sub-microcomputer 18 has a well-known CPU, ROM, RAM and so on, and controls all the voltage detection ICs 11-15. The high-voltage power circuit 19 generates an operating voltage Vcc of the differential amplifier OP, the A/D converter 17 and the sub-microcomputer 18 from a supply voltage of the corresponding to blocks B1-B5. The breaker switch S is provided between a positive terminal of the respective blocks B1-B5 and the high-voltage power circuit 19. The breaker switch S switches the supply voltage of blocks B1-B5 corresponding to the high-voltage power circuit 19, and the power supply corresponding to the respective voltage detection ICs 11-15. For example, the breaker switch S is constructed from a PNP type transistor.

As shown in FIG. 1, the above mentioned-voltage detecting device has a first transmitting line LT1 and first receiving line LR1 as first communication lines, a first insulating interface 21. The first transmitting line LT1 and the first receiving line LR1 connect the voltage detection ICs 11-15 to each other in series. Since a ground level differs according to the respective voltage detection ICs 11-15, it is required to provide the first transmitting line LT1 and first receiving line LR1, which are arranged between the voltage detection ICs 11-15 respectively, with a level shift circuit (not shown).

Furthermore, the first transmitting line LT1 and the first receiving line LR1 connect the bottom voltage detection IC 11 of voltage detection ICs 11-15 with the main microcomputer 10. That is, the first transmitting line LT1 and the first receiving line LR1 connect the main microcomputer 10, the voltage detection IC 11, the voltage detection IC 12, the voltage detection IC 13, the voltage detection IC 14, and the voltage detection IC 15 in series and in this order.

The insulating interface 21 is provided on the first transmitting line LT1 and the first receiving line LR1, which are arranged between the bottom voltage detection IC 11 and the main microcomputer 10, and connects the voltage detection IC 11 with the main microcomputer 10 at the electrically insulated state. The bottom voltage detection IC 11 and the main microcomputer 10 can transmit and receive information in insulated condition each other by the first insulating interface 21. Thereby, insulation between the high-voltage battery BH and the low-voltage battery BL can be hold. The first insulating interface 21 is optical devices such as photo-couplers of a light emitting element and a light detecting element, or magnetic devices such as magnetic-couplers.

Figure 3:
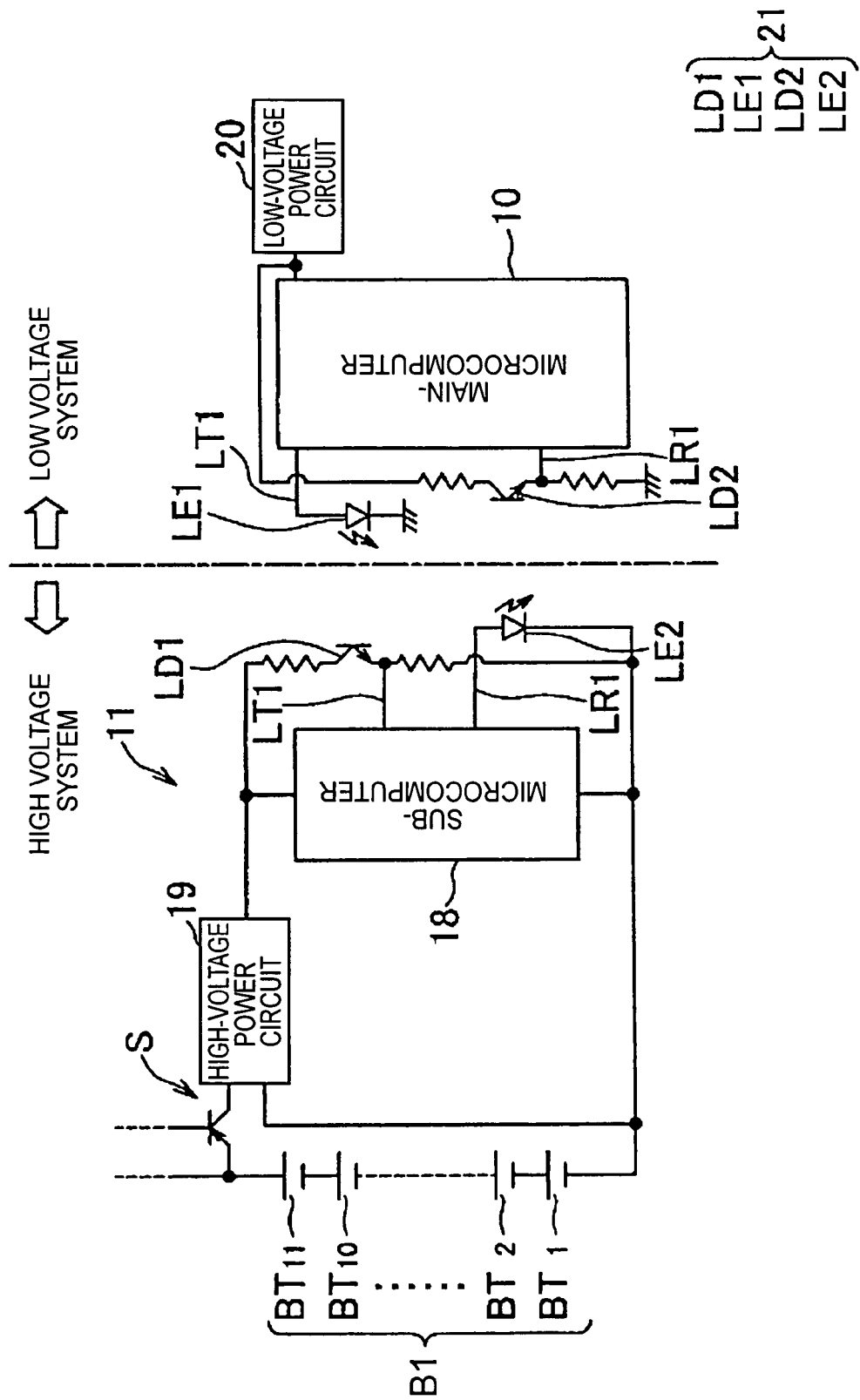
FIG. 3 is a detailed electrical connection of the voltage detecting device of FIG. 1 when photo-couplers are utilized as a first insulating interface in FIG. 1.

FIG. 3 shows an electrical connection of the first insulating interface 21 of the voltage detecting device shown in FIG. 1. The details of the voltage detection IC 11 and so on are omitted in FIG. 3. As shown in FIG. 3, the first insulating interface 21 has a light emitting element LE1 and a light receiving element LD2, which are arranged in a low voltage system, and a light emitting element LE2 and a light receiving element LD1, which are arranged in a high voltage system. In the light emitting element LE1, one terminal is connected to the main microcomputer 10, and another terminal is connected to a ground. When electrical signals are outputted from the main microcomputer 10, current flows and the light emitting element LE1 emits light.

The light receiving element LD1 is arranged between the high-voltage power circuit 19 of the block B1 and a negative terminal of the unit cell BT1. The light detecting element LD1 is turned on when received lights from the light emitting element LE1, and supplies electrical signals to the sub-microcomputer 18 through the first transmitting line LT1. The electrical signals are thereby transmitted from the main microcomputer 10 to the sub-microcomputer 18 of the block B1 at the electrically insulated state.

On the other hand, in the light emitting element LE2, one terminal is connected to the sub-microcomputer 18, and another terminal is connected to the negative terminal of the unit cell BT1. When electrical signals are outputted from the sub-microcomputer 18, current flows and the light emitting element LE2 emit light. The light receiving element LD2 is arranged between the low-voltage power circuit 20 and a ground. The light detecting element LD2 is turned on when received lights from the light emitting element LE2, and supplies electrical signals to the main microcomputer 10 through the first receiving line LR1. The electrical signals are thereby transmitted from the sub-microcomputer 18 of the block B1 to the main microcomputer 10 at the electrically insulated state.

Furthermore, as shown in FIG. 1, the above mentioned voltage detecting device has a second transmitting line LT2 as a second communication line, a second insulating interface 22, and ON/OFF interfaces 31-35. Thereby, the breaker switch S is turned on depending on output of power source signal from the main microcomputer 10. That is, the second transmitting line LT2 is arranged between a base of each PNP type transistor including each breaker switch S and the main microcomputer 10. The second transmitting line LT2 includes a main line Ls and a plurality of branch lines Lb1-Lb5. One terminal of the main line Ls is connected to the main microcomputer 10. The plurality of branch lines Lb1-Lb5 branches from another terminal of the main line Ls. The branch lines Lb1-Lb5 are connected to the bases of PNP type transistor having the breaker switch S, respectively.

The second insulating interface 22 is arranged on the main line Ls, and connects the breaker switch S with the main microcomputer 10 at electrically insulated state. The high voltage battery BH and low voltage battery BL thereby are insulated each other. The second insulating interface 22 is optical devices such as photo-couplers of a light emitting element and a light receiving element, or magnetic devices such as magnetic-couplers. The above ON/OFF interfaces 31-35 are arranged corresponding to branch lines Lb1-Lb5 respectively, and converts the power source signal, which is transmitted from the main microcomputer 10, to suitable signal level so as to switch the breaker switch S to ON and OFF.

Figure 4:
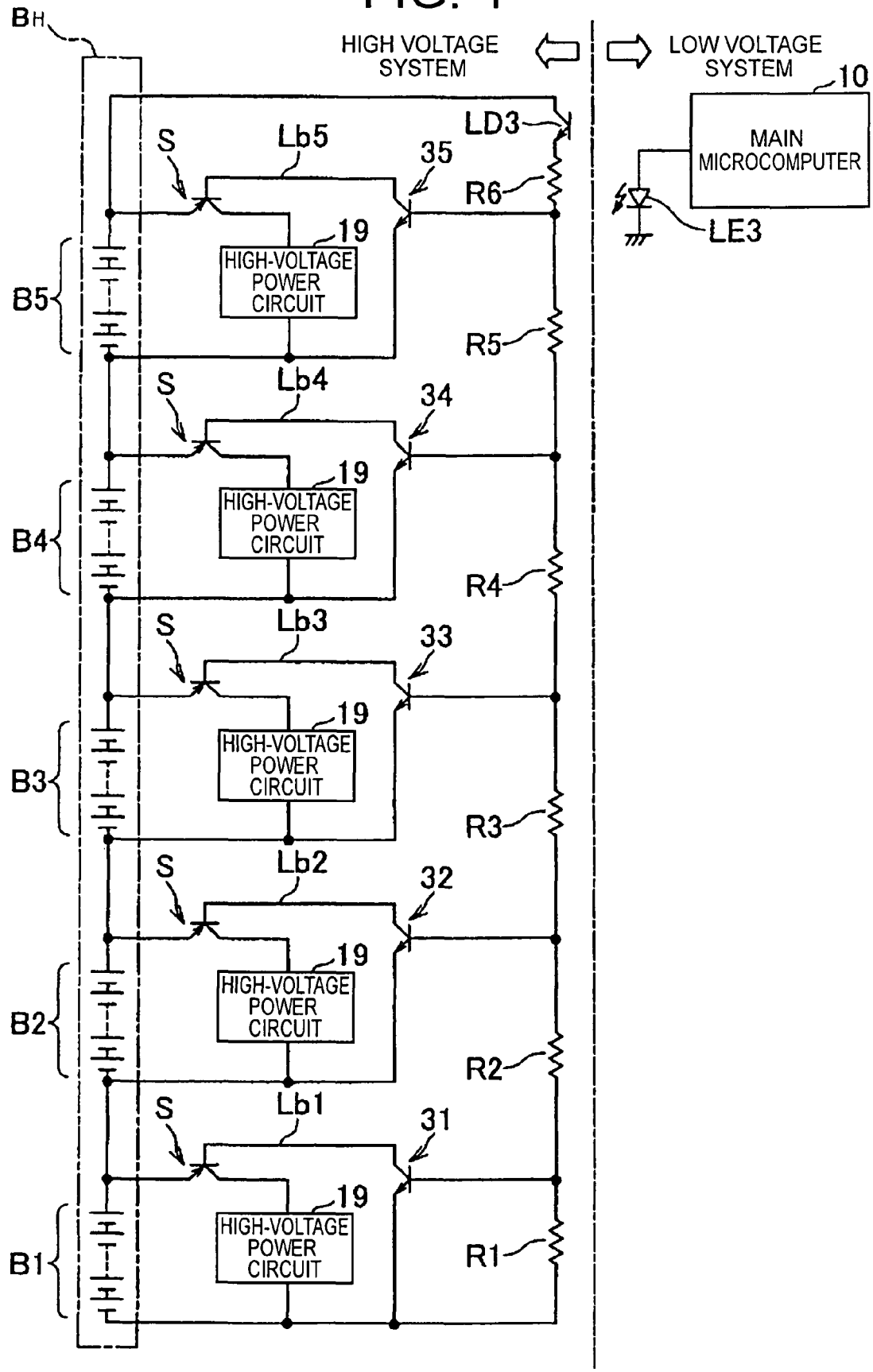
FIG. 4 is a detailed electrical connection of the voltage detecting device of FIG. 1 when photo-couplers are utilized as a second insulating interface shown in FIG. 1.

In the following, the above described second communication lines, that is, the second transmitting line LT2, the second insulating interface 22 and the ON/OFF interfaces 31-35 will be explained with reference to FIG. 4. As shown in FIG. 4, the second insulating interface 22 has a light emitting element LE3 and a light receiving element LD3. The light emitting element LE3 is arranged in a low voltage system, and the light receiving element LD3 is arranged in a high voltage system. In the light emitting element LE3, one terminal is connected to the main microcomputer 10, and another terminal is connected to the ground. When electrical signals are outputted from the main microcomputer 10, current flows and the light emitting element LE3 emits light.

Furthermore, in the light receiving element LD3, one terminal is connected to a positive terminal of the top block B5, and another terminal is connected to a negative terminal of the least block B1 through voltage-divider resistors R1-R6. A contact point between the voltage-divider resistor R1 and the voltage-divider resistor R2 is connected to a gate of the NPN type transistor having the ON/OFF interface 31. A contact point between the voltage-divider resistor R2 and the voltage-divider resistor R3 is connected to a gate of the NPN type transistor having the ON/OFF interface 32. A contact point between the voltage-divider resistor R3 and the voltage-divider resistor R4 is connected to a gate of the NPN type transistor having the ON/OFF interface 33. A contact point between the voltage-divider resistor R4 and the voltage-divider resistor R5 is connected to a gate of the NPN type transistor having the ON/OFF interface 34. A contact point between the voltage-divider resistor R5 and the voltage-divider resistor R6 is connected to a gate of the NPN type transistor having the ON/OFF interface 35.

Each emitter of the NPN type transistor having the ON/OFF interfaces 31-35 is connected to a negative terminal of each block B1-B5. Each collector of the NPN type transistor having the ON/OFF interfaces 31-35 is connected to the base of the PNP type transistor having the breaker switch S. Thereby, when the main microcomputer 10 supplies the power source signal to the light emitting element LE3, the power source flows to the light emitting element LE3 and emits light. Thereby, the light receiving element LD3 is turned on when received lights from the light emitting element LE3. By turning on the light receiving element LD3, the each NPN type transistor having the ON/OFF interfaces 31-35 is turned on. And, according to ON of each ON/OFF interface 31-35, each PNP type transistor having the breaker switch S is turned on, and the power source is supplied to each voltage detection IC 11-15. That is, ON/OFF of power source of each voltage detection IC 11-15 is controlled by the supply of the power source signal from the main microcomputer 10.

Figure 5:
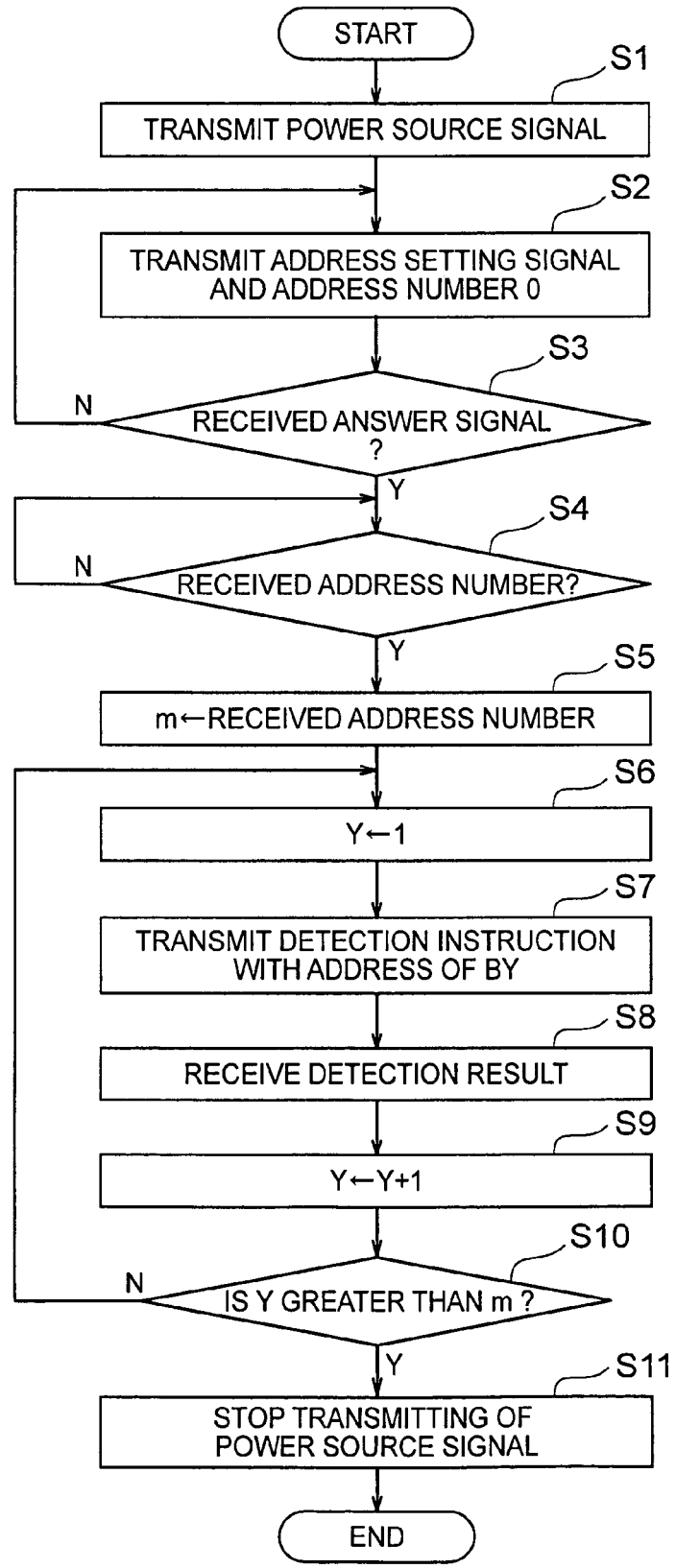
FIG. 5 is a flowchart showing a process of a main microcomputer shown in FIG. 1.

Structure of the above described voltage detecting device will be explained with reference to FIGS. 5 to 7. When an ignition in a vehicle is switched to OFF from ON, the main microcomputer 10 starts a process and transmits the power source signals of H level to the second transmitting line LT2 (step S1 shown in FIG. 5). The breaker switch S of each block B1-B5 is turned on by transmission of the power source signals of H level. Thereafter, the power source is supplied to each voltage detection IC 11-15, and action is started. Next, the main microcomputer 10 transmits an address setting signal and an address number 0 to the sub-microcomputer 18 of the block B1 connected to the main microcomputer 10 through the first transmitting line LT1 (step S2).

When the sub-microcomputer 18 of the block B1 receives the address setting signal and the address number 0 (Y at step S12 in FIG. 6) from the main microcomputer 10, the sub-microcomputer 18 transmits an answer signal to the main microcomputer 10 connected to a lower side (step S13). When the above answer signals from the sub-microcomputer 18 (Y at step S3 in FIG. 5) is received in the main microcomputer 10, the main microcomputer 10 enters a reception wait state of the top end address (step S4). On the other hand, when the answer signal is not received (N at step S3), the main microcomputer 10 returns to the step 2 and transmits the address setting signal and the address number 0 to the sub-microcomputer 18 of the block B1 again.

After transmitting the answer signal (step S13 in FIG. 12), the sub-microcomputer 18 of the block B1 sets the address number 1, which adds 1 (predetermined value) to the address number 0 received through the first transmitting line LT1 of the main microcomputer 10, to the self-address number (step S14). Thereafter, the sub-microcomputer 18 of the block B1 transmits the self-address number 1, which adds 1 to the address number 0 received at step S12, to the sub-microcomputer 18 of the block B2 through the first transmitting line LT1, which is arranged apart from the main microcomputer 10 (step S15).

When the sub-microcomputer 18 of the block 2 receives the address number 1 (Y at step S12), the sub-microcomputer 18 of the block B2 transmits the answer signal to the sub-microcomputer 18 of the block B1 connected to the lower side (the main microcomputer 10 side). When the sub-microcomputer 18 of the block B1 receives the answer signal (Y at step S16), the sub-microcomputer 18 of the block B1 determines that the sub-microcomputer 18 of the block B1 is not the top end. Thereby, the sub-microcomputer 18 of the block B1 enters a reception wait state of the top end address from the upper side (step S17).

As described above, the main microcomputer 10 performs action of steps S2 and S3. According to this action, the sub-microcomputer 18 of each block B1-B5 performs action of steps S12 and S15 in order. Thereby, as mentioned below, transmitting and receiving of the address number are performed between the main microcomputer 10 and the sub-microcomputer 18 of each block B1-B5. That is, as shown in FIG. 7, the address number 0 is transmitted from the main microcomputer 10 to the sub-microcomputer 18 of the block B1. Next, the address number 1 is transmitted from the sub-microcomputer 18 of the block B1 to the sub-microcomputer 18 of the block B2, and then the address number 2 is transmitted from the sub-microcomputer 18 of the block B2 to the sub-microcomputer 18 of the block B3. Thereafter, the address number 3 is transmitted from the sub-microcomputer 18 of the block B3 to the sub-microcomputer 18 of the block B4. Finally, the address number 4 is transmitted from the sub-microcomputer 18 of the block B4 to the sub-microcomputer 18 of the block B5. Thereby, the sub-microcomputer 18 of each block B1-B5 sets each address number 1-5 as a self-address.

The sub-microcomputer 18 of the block B5 set the address number 5 to the self-address (step S14), and transmits the self-address number 5 to the upper side (step S15). Thereafter, the sub-microcomputer 18 of the block B5 enters a reception wait state of the answer signal (step S16). Since the block B5 is the top end, the above answer signal is not received. In the sub-microcomputer 18 of the block B5, when the answer signal is not received (N at step S16), the sub-microcomputer 18 of the block B5 concludes that the voltage detection ICs 11-15 is not connected to the upper side through the first transmitting line LT1 and the receiving line LR1. That is, the sub-microcomputer 18 of the block B5 determines that the block B5 is the top end of the blocks, and transmits the self-address number of the block B5 to the sub-microcomputer 18 of the block B4 through the first receiving line LR1 connected to the lower side as the address number of the top end (step S19).

When the address number is received from the sub-microcomputer 18 of the block B5 connected to the upper side (step S17), the sub-microcomputer 18 of the block B4 transmits the received address number to the sub-microcomputer 18 of the block B3 connected to the lower side (step S18). The sub-microcomputer 18 of the block B5 performs action of step S19. According to this action, the sub-microcomputer 18 of each block B4-B1 performs action of steps S17 and S18 in order. Thereby, as described below, transmitting and receiving of the address number are performed between the main microcomputer 10 and the sub-microcomputer 18 of each block B1-B5. That is, as shown in FIG. 7, the address number 5, which is transmitted from the sub-microcomputer 18 of the block B5, is transmitted to the main microcomputer 10 via the sub-microcomputers 18 of the blocks B4, B3, B2 and B1 in this order.

When the address number 5 is received (Y at step S4 in FIG. 5), the main microcomputer 10 assigns the received address number 5 to an address area m of the top end arranged in a memory area (not shown) at step S5. Thereby, all settings of the address number in the voltage detection ICs 11-15 are completed. Next, the main microcomputer 10 writes 1 into an address area Y of a memory device (not shown) as step S6, and outputs a detection instruction including an assignment of an address of a block BY to the first transmitting line LT1 (step S7). Furthermore, the detection instruction is a signal so as to instruct detection of voltage between both terminals of each unit cell BT(Y×11−10)-BT(Y×11) which constructs the block BY of the specified address number Y.

After that, when a detection result is received from the sub-microcomputer 18 of the block BY of the address number Y at step S8, the main microcomputer 10 stores the received detection result into the memory area (not shown) and assign Y+1 to the address area Y at step 9. If Y is equal to or less than m (N at step S10), the main microcomputer 10 returns to step S6 again. The action of the steps S6-S9 continues until Y becomes greater than m. That is, the detection instruction which specifies the address numbers 1-5 is transmitted from the main microcomputer 10 in order as shown in FIG. 7.

As described above, when the detection instruction, which specifies the address number 1, is received from the main microcomputer 10 in the sub-microcomputer 18 of the block B1 (step S20 in FIG. 6), the sub-microcomputer 18 of the block B1 determines that its detection instruction is instruction to self, that is, the sub-microcomputer 18 of the block B1 (Y at step S21). And then, the sub-microcomputer 18 of the block B1 executes a process for detecting a voltage at step S31. The sub-microcomputer 18 of the block B1 executes the process for detecting the voltage (step S31), and detects the voltage between both terminals of each unit cell BT1-BT11 constructing the block B1. Then, the sub-microcomputer 18 of the block B1 attaches the self-address number 1 to the detection result and transmits the detection result, which attaches the self-address number 1, to the main microcomputer 10 connected to the lower side (step S32). Thereafter, the sub-microcomputer 18 returns to step S20.

When the main microcomputer 10 receives the detection result to which the address number 1 is attached, the main microcomputer 10 transmits the detection instruction specifying the address number 2. When the sub-microcomputer 18 of the block B1 receives the detection instruction specifying the address number 2 from the main microcomputer 10 (step S20), the sub-microcomputer 18 of the block B1 determines that its detection instruction is not instruction to self (N at step S21) Then, the sub-microcomputer 18 of the block B1 transmits the detection instruction specifying the address number 2 to the sub-microcomputer 18 of the block B2 connected to the upper side (step S23).

When the sub-microcomputer 18 of the block B2 receives the above detection instruction specifying the address number 2 from the sub-microcomputer 18 of the block B1, the sub-microcomputer 18 of the block B2 determines that its detection instruction is instruction to self, that is, the own sub-microcomputer 18 of the block B2 (Y at step S21). And then, the sub-microcomputer 18 of the block B1 executes a process for detecting a voltage at step S31, and detects the voltage between both terminals of each unit cell BT12-BT22 constructing the block B2. Thereafter, the sub-microcomputer 18 of the block B2 attaches the address number 2 to the detection result, and transmits the detection result including the address number 2 to the sub-microcomputer 18 of the block B1 connected to the lower side (step S32). When the sub-microcomputer 18 of the block B1 receives the detection result from the sub-microcomputer 18 of the block B2 connected to the upper side (step S24), the received detection result is transmitted to the main microcomputer 10 connected to the lower side from the sub-microcomputer 18 of the block B1 (step S25). Thereafter, the sub-microcomputer 18 of the block returns to step S24.

As mentioned above, the main microcomputer 10 repeats action of the steps S6-S9. According to this action, the sub-microcomputer 18 of each block B1-B5 performs the steps S20-S24 in order. Thereby, as shown below, transmitting and receiving of signals is performed between the main microcomputer 10 and the sub-microcomputer 18 of each block B1-B5. That is, as shown in FIG. 7, the detection instruction which specifies the address number 1 from the main microcomputer 10 is transmitted to the sub-microcomputer 18 of the block B1. And, the detection result from the sub-microcomputer 18 of the block B1 is transmitted to the main microcomputer 10. And then, the detection instruction, which specifies the address number 2 from the main microcomputer 10, is transmitted to the sub-microcomputer 18 of the block B2 through the block B1. Also, the detection result from the sub-microcomputer 18 of the block B2 is transmitted to the main microcomputer 10 through the block B1.

Next, the detection instruction which specifies the address number 3 from the main microcomputer 10 is transmitted to the sub-microcomputer 18 of the block B3 through the blocks B1 and B2 in this order. Also, the detection result from the sub-microcomputer 18 of the block B3 is transmitted to the main microcomputer 10 through the blocks B2 and B1 in this order. Thereafter, the detection instruction which specifies the address number 4 from the main microcomputer 10 is transmitted to the sub-microcomputer 18 of the block B4 through the blocks B1, B2 and B3 in this order. Also, the detection result from the sub-microcomputer 18 of the block B4 is transmitted to the main microcomputer 10 through the blocks B3, B2 and B1 in this order. Furthermore, the detection instruction which specifies the address number 5 from the main microcomputer 10 is transmitted to the sub-microcomputer 18 of the block B5 through the blocks B1, B2, B3 and B4 in this order. And then, the detection result from the sub-microcomputer 18 of the block B5 is transmitted to the main microcomputer 10 through the blocks B4, B3, B2 and B1 in this order.

When the main microcomputer 10 adds Y+1 to the address area Y after receiving the detection result from the block B5 (step S9), Y becomes greater than m (Y at step S10). Thereby, the main microcomputer 10 considers that the voltage detection of all the unit cells BT1-BT55 was finished. As a result, the main microcomputer 10 stops the supply of power source signal (step S11) and ends the process. By stopping the supply of the power source signal, the breaker switch S of each block B1-B5 is turned off. Thereby, the power source supply of each voltage detection IC 11-15 is stopped.

According to the above voltage detecting device, the main microcomputer 10 transmits the address number 0 to the sub-microcomputer 18 of the block B1 connected through the first transmitting line LT1. When the sub-microcomputer 18 of each voltage detection IC 11-15 receives the address number through the first transmitting line LT1 of the lower side, the address number which adds 1 to the received address number is set as the self-address number. Furthermore, the self-address number which adds 1 to the received address number is transmitted to the first transmitting line LT1. Thereby, the addresses of the voltage detection ICs 11-15 can be set by communication through the first transmitting line LT1. Also, even if the power source level of each voltage detection IC 11-15 differs, the address of the respective voltage detection ICs 11-15 can be set.

In addition, according to the voltage detecting device, when a voltage detection IC is not connected to another voltage detection IC of the upper side through the first transmitting line LT1 and the first receiving line LR1, the sub-microcomputer 18 of the voltage detection IC transmits the self-address number to the voltage detection IC of the lower side which are connected with the first transmitting line LR1 and the first receiving line LR1. Furthermore, when the address number is received through the first transmitting line LT1 of the upper side and the first receiving line LR1 of the upper side, the sub-microcomputer 18 of each voltage detection IC 11-15 transmits the received address number to the first transmitting line LT1 of the lower side and the first receiving line LR1 of the lower side. Thereby, the address number 5 of the voltage detection IC 15 of the top end (the farthest voltage detection IC from the main microcomputer 10) can be automatically transmitted to the main microcomputer 10. As a result, it is not required to set the address number of the top end to the main microcomputer 10 with another process.

Furthermore, according to the voltage detecting device, the second transmitting line LT2 is provided. Thereby, ON/OFF of the power source against each voltage detection IC 11-15 can be controlled by the main microcomputer 10.

Additionally, according to the voltage detecting device, the voltage detection ICs 11-15 perform the action of the address setting whenever the power source supply is started. Thereby, the voltage detecting device can automatically perform the address setting by the power source supply without an external terminal which makes the voltage detection ICs start the action for setting the address.

According to the above mentioned embodiment, the voltage detection ICs 11-15 set a value, which adds 1 to the address number received from the lower side, as a self-address. The embodiments of the present invention are not limited thereto. For example, the address number received from the lower side as a self-address can be set. In this case, a value which adds 1 to the self-address is transmitted to the upper side.

Furthermore, the first transmitting line LT1 and the first receiving line LR1 are connected between the sub-microcomputer 18 of the bottom voltage detection IC 11 and the main microcomputer 10 but not limited thereto. For example, the first transmitting line LT1 and the first receiving line LR1 may be connected between the sub-microcomputer 18 of the top voltage detection IC 15 and the main microcomputer 10. In this case, the main microcomputer 10 is the upper side contrary to the above embodiment. Thereby, a side away from the main microcomputer 10 is the lower side.

In addition, according to the above embodiment, every time the power source is supplied to the voltage detection ICs 11-15, the main microcomputer 10 reset an address. The embodiments of the present invention are not limited thereto. For example, the voltage detecting device can start an address setting according to ON of a DIP switch which is connected to the main microcomputer 10 and the sub-microcomputer 18 by storing the address on a nonvolatile memory device.

While, in the embodiment, the present invention is described, it is not limited thereto. Various change and modifications can be made with the scope of the present invention.

What is claimed is:

1. A voltage detecting device comprising:
a plurality of voltage detecting units for detecting a voltage between both terminals of each unit cell, which is secondary battery type, included in respective blocks, the voltage detecting unit being provided for each block of the respective blocks divided from a battery unit formed with a plurality unit cells connected in series to each other; and
a control device for receiving a detection result from the voltage detecting unit,
wherein the voltage detecting device has a first communication line for connecting the plurality of voltage detecting units in series each other and for connecting between a top end or bottom of the plurality of the voltage detecting units and the control device,
wherein the control device transmits an address number of the voltage detection unit to the voltage detecting unit connected through the first communication line, and
wherein the respective plurality of the voltage detecting units perform an action for setting an address, the action setting the received address number or an address number adding a predetermined value to the received address number as a self-address number and transmitting an address number adding 1 to the received address number to the first communication line away from the control device when the respective voltage detecting units receive the address number through the first communication line from the control device.

2. The voltage detecting device as claimed in claim 1, wherein when the voltage detecting unit is not connected to the first communication line away from the control device, the respective voltage detecting units transmit the self-address number to the voltage detecting unit connected to the control device through the first communication line, and when the address number is received through the first communication line away from the control device, the respective voltage detecting units transmit the received address number to the first communication line connected to the control device.

3. The voltage detecting device as claimed in claim 1, wherein the voltage detecting device has a second communication line for connecting the control device to the plurality of the voltage detecting unit, the control device transmits a power source signal to the second communication line, and a power source is supplied to the voltage detecting unit when the plurality of the voltage detecting units receives the power source signal through the second communication line.

4. The voltage detecting device as claimed in claim 3, wherein the voltage detecting unit performs the action for setting the address whenever the power source supply is started.

5. The voltage detecting device as claimed in claim 2, wherein the voltage detecting device has a second communication line for connecting the control device to the plurality of the voltage detecting unit, the control device transmits a power source signal to the second communication line, and a power source is supplied to the voltage detecting unit when the plurality of the voltage detecting units receive the power source signal through the second communication line.

* * * * *